United States Patent
Lobana et al.

(10) Patent No.: US 10,635,515 B2
(45) Date of Patent: Apr. 28, 2020

(54) RECOVERY OF PARTIAL MEMORY DIE

(71) Applicant: SANDISK TECHNOLOGIES LLC, Plano, TX (US)

(72) Inventors: Sukhminder Singh Lobana, Fremont, CA (US); Kirubakaran Periyannan, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 167 days.

(21) Appl. No.: 15/834,050

(22) Filed: Dec. 6, 2017

(65) Prior Publication Data

US 2019/0171506 A1 Jun. 6, 2019

(51) Int. Cl.
G06F 11/00 (2006.01)
G06F 11/07 (2006.01)
G11C 29/00 (2006.01)

(52) U.S. Cl.
CPC ........ *G06F 11/073* (2013.01); *G06F 11/0754* (2013.01); *G11C 29/76* (2013.01); *G11C 29/808* (2013.01); *G11C 29/88* (2013.01); G06F 2212/7201 (2013.01)

(58) Field of Classification Search
CPC .... G06F 11/073; G06F 11/0754; G11C 29/76; G11C 29/808; G11C 29/88
See application file for complete search history.

(56) References Cited

U.S. PATENT DOCUMENTS

| | | | |
|---|---|---|---|
| 6,014,724 A | 1/2000 | Jenett | |
| 6,065,090 A * | 5/2000 | Deas | G11C 29/76 711/1 |
| 6,260,156 B1 | 7/2001 | Garvin | |
| 6,337,829 B1 * | 1/2002 | Lee | G11C 29/88 365/230.01 |
| 6,426,893 B1 | 7/2002 | Conley | |
| 6,633,963 B1 | 10/2003 | Ellison | |
| 6,901,498 B2 | 5/2005 | Conley | |
| 7,434,122 B2 | 10/2008 | Jo | |
| 7,551,477 B2 | 6/2009 | Mokhlesi | |
| 9,449,698 B1 | 9/2016 | Paudel | |
| 2004/0111553 A1* | 6/2004 | Conley | G06F 12/0246 711/103 |
| 2005/0144516 A1 | 6/2005 | Gonzalez | |
| 2006/0109725 A1 | 5/2006 | Yoon | |
| 2008/0112238 A1 | 5/2008 | Kim | |

(Continued)

*Primary Examiner* — Joshua P Lottich
(74) *Attorney, Agent, or Firm* — Vierra Magen Marcus LLP

(57) ABSTRACT

A partial memory die is removed from an edge of a wafer such that the partial memory die is missing a portion of the memory structure that was not printed on the wafer. A usable portion of the incomplete memory structure is determined and one or more rectangular zones in the usable portion of the incomplete memory structure are identified. During operation of the memory system, the memory system receives logical addresses for memory operations to be performed on the partial memory die and determines physical addresses that corresponding to the logical addresses. The memory system performs an out of bounds response for a physical address that is on the partial memory die but outside of the one or more rectangular zones. The memory system performs memory operations for physical addresses that are inside the one or more rectangular zones.

20 Claims, 14 Drawing Sheets

(56) References Cited

U.S. PATENT DOCUMENTS

| | | | |
|---|---|---|---|
| 2008/0151637 A1 | 6/2008 | Doyle | |
| 2010/0332729 A1* | 12/2010 | Alrod | G06F 11/1068 |
| | | | 711/103 |
| 2012/0047409 A1 | 2/2012 | Post | |
| 2012/0257467 A1* | 10/2012 | Kosugi | G11C 29/56008 |
| | | | 365/200 |

* cited by examiner

RECOVERY OF PARTIAL MEMORY DIE

BACKGROUND

Semiconductor memories, such as flash memory and other types of memories, are often manufactured on a semiconductor wafer (or other material). Reticles are used to print circuits (or images of circuits) on the wafer. The reticle is moved across a wafer for a plurality of shots. Because the memory die is square and the wafer is round there will be dies printed at the edge for which a portion of the die is off the edge of the wafer, thereby, making the die incomplete (and referred to as a partial memory die). For example, FIG. 1 depicts a wafer 10. A plurality of instances of a memory system are fabricated on wafer 10. Each instance of the memory system will become a memory die. Eventually, wafer 10 will be cut into separate dies in a process referred to as singulation. FIG. 1 shows dies A, B, C, D, E, F and G of wafer 10. It is likely that wafer 10 will include other dies in addition to A-G; however, those other dies are not depicted to make FIG. 1 easier to read. As can be seen, dies A-F are formed within the boundary of wafer 10. However, die G is fabricated at the edge of wafer 10 such that a portion of what should have been die G is off the edge of wafer 10 and, therefore, missing from die G. As a result, die G is a partial memory die.

In the past, partial memory dies were discarded because they were missing components and, therefore, did not function properly.

BRIEF DESCRIPTION OF THE DRAWINGS

Like-numbered elements refer to common components in the different figures.

DETAILED DESCRIPTION

It is proposed to utilize partial memory die that are configured to successfully perform memory operations (e.g., erasing, programming and/or reading). Using partial memory die will increase manufacturing yield and reduce waste. Therefore, more memory die from a wafer can be sold, which increases the revenue derived from a manufactured semiconductor wafer.

Figure 1:
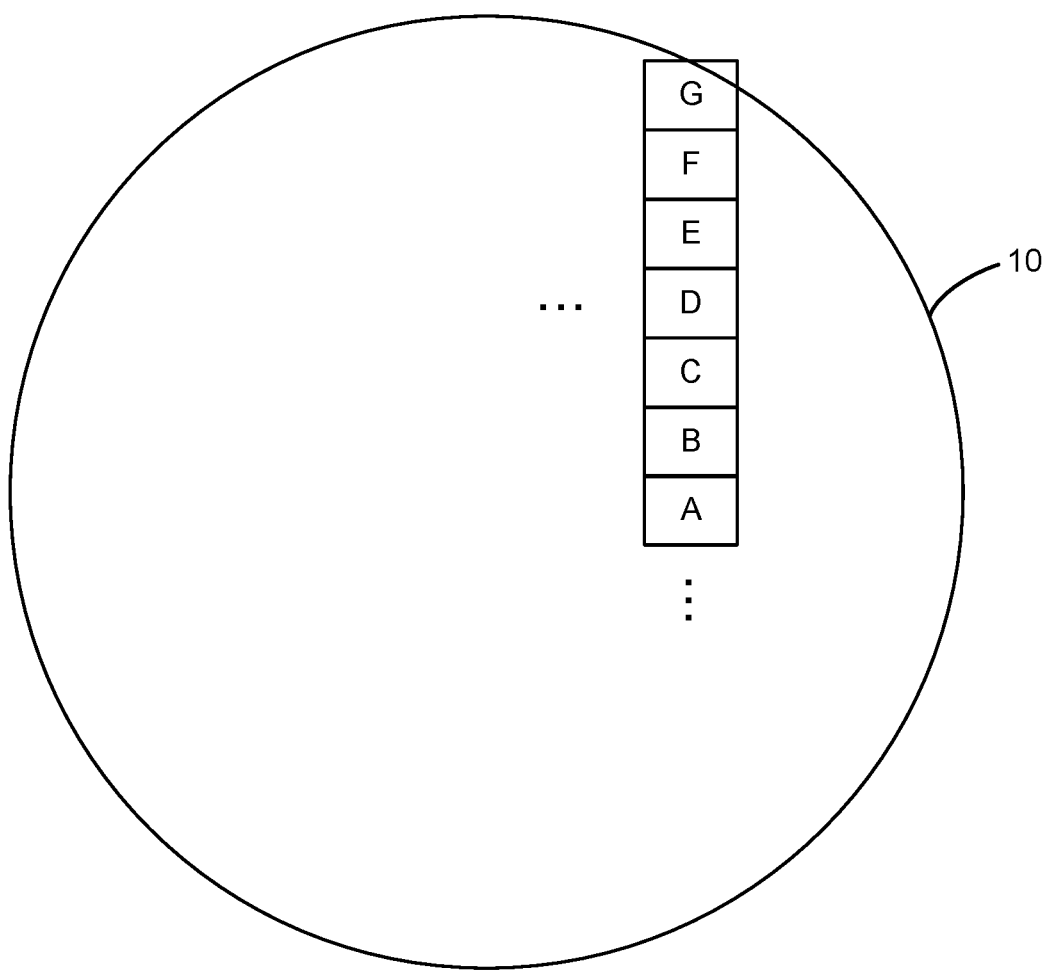
FIG. 1 depicts a wafer.

As used herein, a partial memory die includes a non-volatile memory structure that is missing components due to a portion of that memory structure not being printed (or otherwise fabricated). There may be a variety of reasons that the portion of the memory structure is not printed or otherwise fabricated. In certain embodiments, the portion of the memory structure is not printed or otherwise fabricated because the die positioning on the wafer results in some portion of the die being positioned on the wafer and another portion of the die being positioned beyond the edge of the wafer, as discussed above with respect to die G of FIG. 1. In some embodiments, the partial memory die also includes support circuits connected to the memory structure. The support circuits are configured to store data to the memory structure and read data from the memory structure, even if the memory structure is missing components.

In one embodiment, a partial memory die includes an incomplete memory structure. As used herein, an incomplete memory structure is a memory structure that is missing components that it was designed to have. In certain embodiments, an incomplete memory structure is fabricated due to a fabrication side effect. As described herein, there are a variety of potential fabrication side effects. One example of a fabrication side effect may be, that the partial memory die was positioned near an edge of a wafer such that the incomplete memory structure of the partial memory die is missing a portion that was not printed (or otherwise fabricated) on the wafer. That is, the incomplete memory structure of the partial memory die is missing components that should be part of the memory structure but they were not printed on the wafer because the die was positioned near the edge of the wafer, as explained above with respect to die G of FIG. 1. Another possible fabrication side effect may be misalignment of a wafer dicing machine such that parts of a die are cut during a dicing operation.

A usable portion of the incomplete memory structure is determined and one or more rectangular usable zones in the usable portion of the incomplete memory structure are identified. During operation of the memory system that includes the partial memory die, a control circuit for the memory system determines whether an address for a memory operation is within a usable zone of the incomplete memory structure. If the address is within a usable zone, the control circuit successfully performs the memory operation on non-volatile memory cells in the usable zone.

Figure 2:
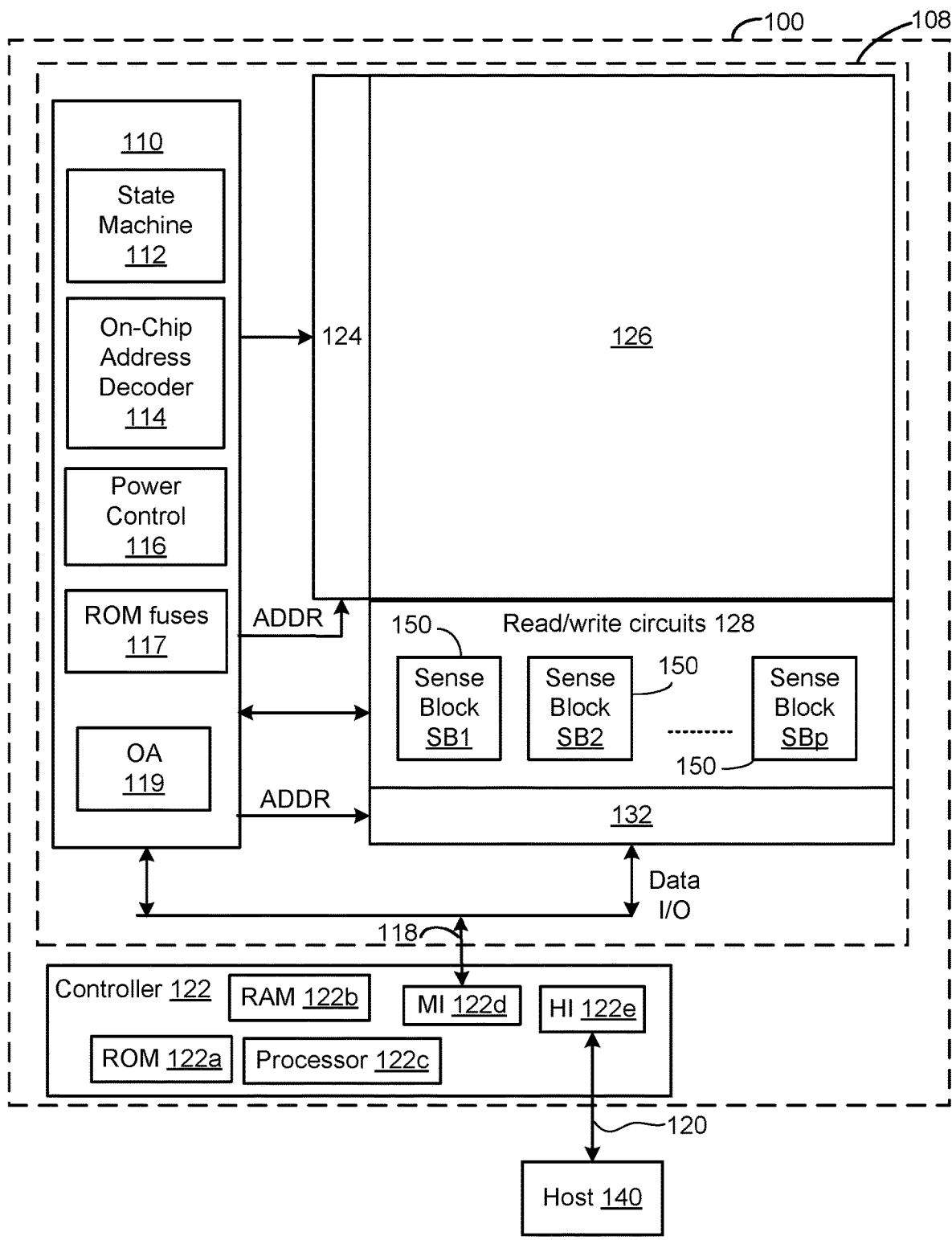
FIG. 2 is a block diagram of a memory system.

FIG. 2 is a functional block diagram of an example memory system that can be implemented on a partial memory die, and successfully perform memory operations using the technology described herein. The components depicted in FIG. 2 are electrical circuits. Memory device 100 includes one or more memory die 108. Each memory die 108 includes a memory structure 126 of memory cells (such as, for example, a three dimensional monolithic array of NAND flash memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., erase, program, read, and others) on memory structure 126, and includes a state machine 112, an on-chip address decoder 114, a power control module 116 and ROM fuses 117. ROM fuses 117 are used to store system parameters. In some embodiments, ROM fuses 117 can be replaced by latches, flip flops or portions of volatile or non-volatile memory. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters (e.g. see FIG. 7B).

In one embodiment, control circuitry 110 includes an operation adjustment circuit OA 119 that is configured to modify a memory operation in response to the memory operation targeting memory cells outside a usable zone of the incomplete memory array (see discussion below). For example, operation adjustment circuit OA 119 can remap a target address for the memory operation from an address outside the usable zone to an address in the usable zone and/or operation adjustment circuit OA 119 can adjust the unit of operation for the memory operation, as discussed in more detail below. In some embodiments, operation adjustment circuit 119 can be part of state machine 112. In other embodiments, the operation adjustment circuit will be on the controller instead of the memory die. In other embodiments, the operation adjustment circuit will be separate from the controller and separate from the memory die, but connected to either one or both of the controller and memory die.

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers.

State machine 112 and/or controller 122, including various combinations of one or more of decoders 114/124/132, power control module 116, sense blocks 150, and read/write circuits 128, can be considered a control circuit (or a managing circuit) that performs the functions described herein. The control circuit can include hardware only or a combination of hardware and software (including firmware). For example, a controller programmed by firmware to perform the functions described herein is one example of a control circuit.

The (on-chip or off-chip) controller 122 (which in one embodiment is an electrical circuit) may comprise one or more processors 122*c*, ROM 122*a*, RAM 122*b*, a memory interface MI 122*d* and a host interface HI 122*e*, all of which are interconnected. One or more processors 122*c* is one example of a control circuit. Other embodiments can use state machines or other custom circuits designed to perform one or more functions. The storage devices (ROM 122*a*, RAM 122*b*) stored code (software) such as a set of instructions (including firmware), and one or more processors 122*c* is/are operable to execute the set of instructions to provide the functionality described herein. Alternatively, or additionally, one or more processors 122*c* can access code from a storage device in the memory structure, such as a reserved area of memory cells connected to one or more word lines. RAM 122*b* can be to store data for controller 122, including caching program data (discussed below). Memory interface MI 122*d*, in communication with ROM 122*a*, RAM 122*b* and processor 122*c*, is an electrical circuit that provides an electrical interface between controller 122 and one or more memory die 108. For example, memory interface MI 122*d* can change the format or timing of signals, provide a buffer, isolate from surges, latch I/O, etc. One or more processors 122*c* can issue commands to control circuitry 110 (or any other component of memory die 108) via Memory Interface MI 122*d*. In one embodiment, one or more processors 122*c* can access code from ROM 122*a* or RAM 122*b* to receive a request to read from the host that includes an operation limitation, perform a read process on the memory die 108 within the operation limitation and return data to the host from the read process that includes errors in response to the request to read. Host interface HI 122*e* provides an electrical interface with host 140 data bus 120 in order to receive commands, addresses and/or data from host 140 to provide data and/or status to host 140.

In one embodiment, memory structure 126 comprises a monolithic three dimensional memory array of non-volatile memory cells in which multiple memory levels are formed above a single substrate, such as a wafer, with no intervening substrates. The memory structure may comprise any type of non-volatile memory that is monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662.

In another embodiment, memory structure 126 comprises a two dimensional memory array of non-volatile memory cells. In one example, the non-volatile memory cells are NAND flash memory cells utilizing floating gates such as described, for example, in U.S. Pat. No. 9,082,502. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAMR), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM or PCMRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
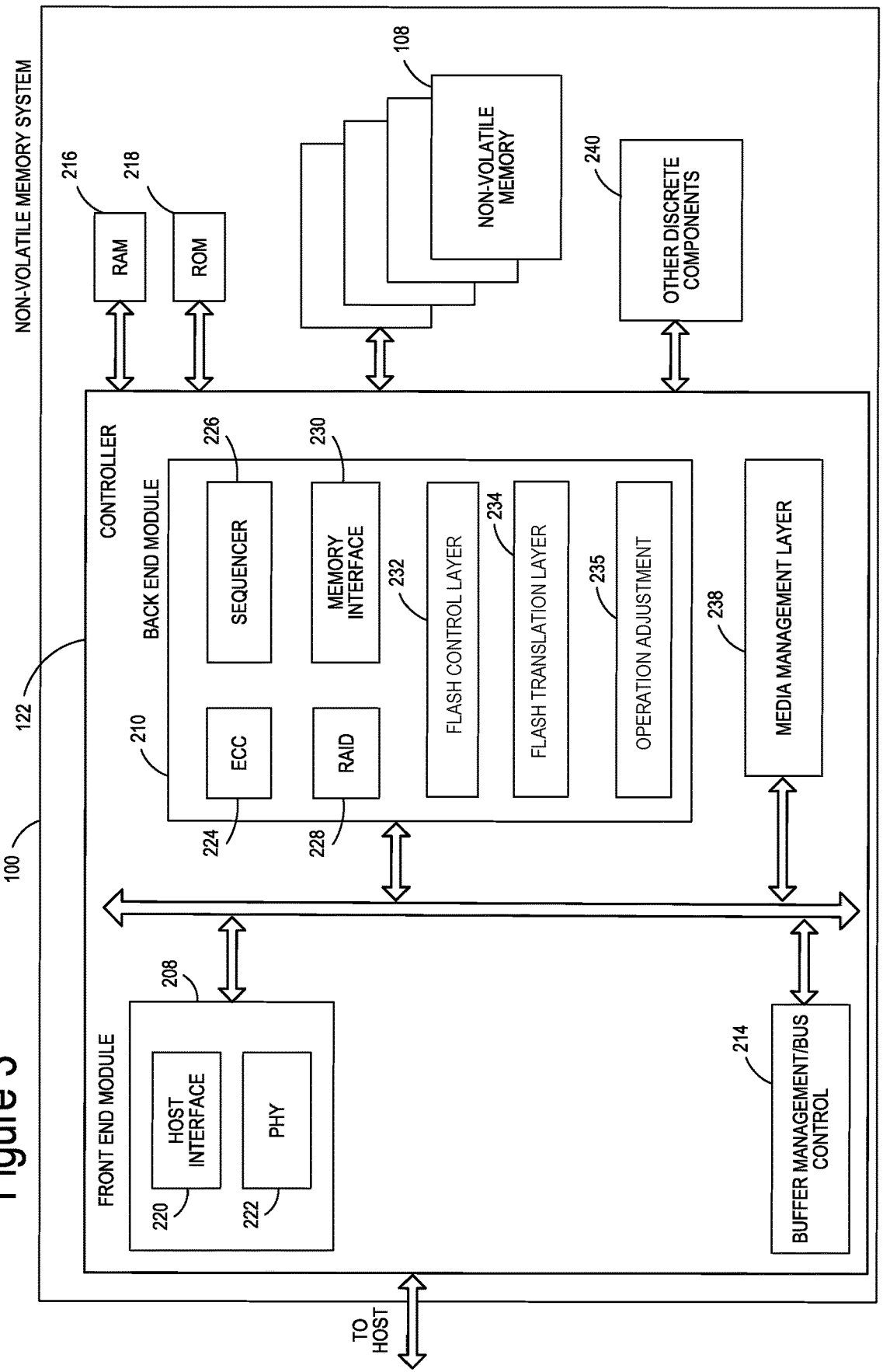
FIG. 3 is a block diagram of a memory system.

FIG. 3 is a block diagram of example memory system 100, depicting more details of one example implementation of controller 122. As used herein, a flash memory controller is a device that manages data stored on flash memory and communicates with a host, such as a computer or electronic device. A flash memory controller can have various functionality in addition to the specific functionality described herein. For example, the flash memory controller can manage the read and programming processes, format the flash memory to ensure the memory is operating properly, map out bad flash memory cells, and allocate spare memory cells to be substituted for future failed cells. Some part of the spare memory cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable memory interface, such as Toggle Mode 200, 400, or 800. In one embodiment, memory system 100 may be a card based system, such as a secure digital (SD) or a micro secure digital (micro-SD) card that can be in or connected to cellular telephones, computers, servers, smart appliances, digital cameras, etc. In an alternate embodiment, memory system 100 may be part of an embedded memory system. In another example, the memory system may be in the form of a solid state disk (SSD) drive (having one or, more memory die 108) installed in or connected to a personal computer or server. Examples of hosts are cellular telephones, computers, servers, smart appliances, digital cameras, etc.

In some embodiments, non-volatile memory system 100 includes a single channel between controller 122 and non-volatile memory die 108, however, the subject matter described herein is not limited to having a single memory channel. For example, in some memory system architectures, 2, 4, 8 or more channels may exist between the controller and a memory die, depending on controller capabilities. In any of the embodiments described herein, more than a single channel may exist between the controller and the memory die, even if a single channel is shown in the drawings.

As depicted in FIG. 3, controller 126 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function or related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor or circuit for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, controller 122, RAM 216, and ROM 218 may be located on separate semiconductor die. In some embodiments, a portion of RAM 216 is used to cache program data.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 (electrical circuit, software or combination of circuit and software) that encodes the data bytes received from the host, and decodes and error corrects the data bytes read from the non-volatile memory. A command sequencer 226 generates command sequences, such as program/read/erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface.

A flash control layer 232 (firmware and/or hardware, such as an electrical circuit) controls the overall operation of back end module 210. Flash control layer 232 includes a program manager that manages the performing of memory operations described below (see FIGS. 13 and 14). The program manager can be implemented as a dedicated electrical circuit or via software (e.g., firmware).

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122. Flash translation layer 234 manages the translation between logical addresses and physical addresses. Logical addresses are used to communicate with the host. Physical addresses are used to communicate with the memory die. Flash translation layer 234 can be a dedicated electrical circuit or firmware.

In one embodiment, back end module 210 includes also includes operation adjustment module or circuit 235 that is configured to modify a memory operation in response to the memory operation targeting memory cells outside a usable zone of the incomplete memory array (see discussion below). For example, operation adjustment module or circuit 235 can remap a target address for the memory operation from an address outside the usable zone to an address in the usable zone and/or operation adjustment module or circuit 235 can adjust the unit of operation for the memory operation, as discussed in more detail below. Operation adjustment module or circuit 235 can be hardware only or a combination of hardware and software (e.g., firmware programming a processor).

Controller 122 may interface with one or more memory dies 108. In one embodiment, controller 122 and multiple memory dies (together comprising non-volatile storage system 100) implement a SSD, which can emulate, replace or be used instead of a hard disk drive inside or connected to a host, as a NAS device, etc. Additionally, the SSD need not be made to emulate a hard drive.

Figure 4:
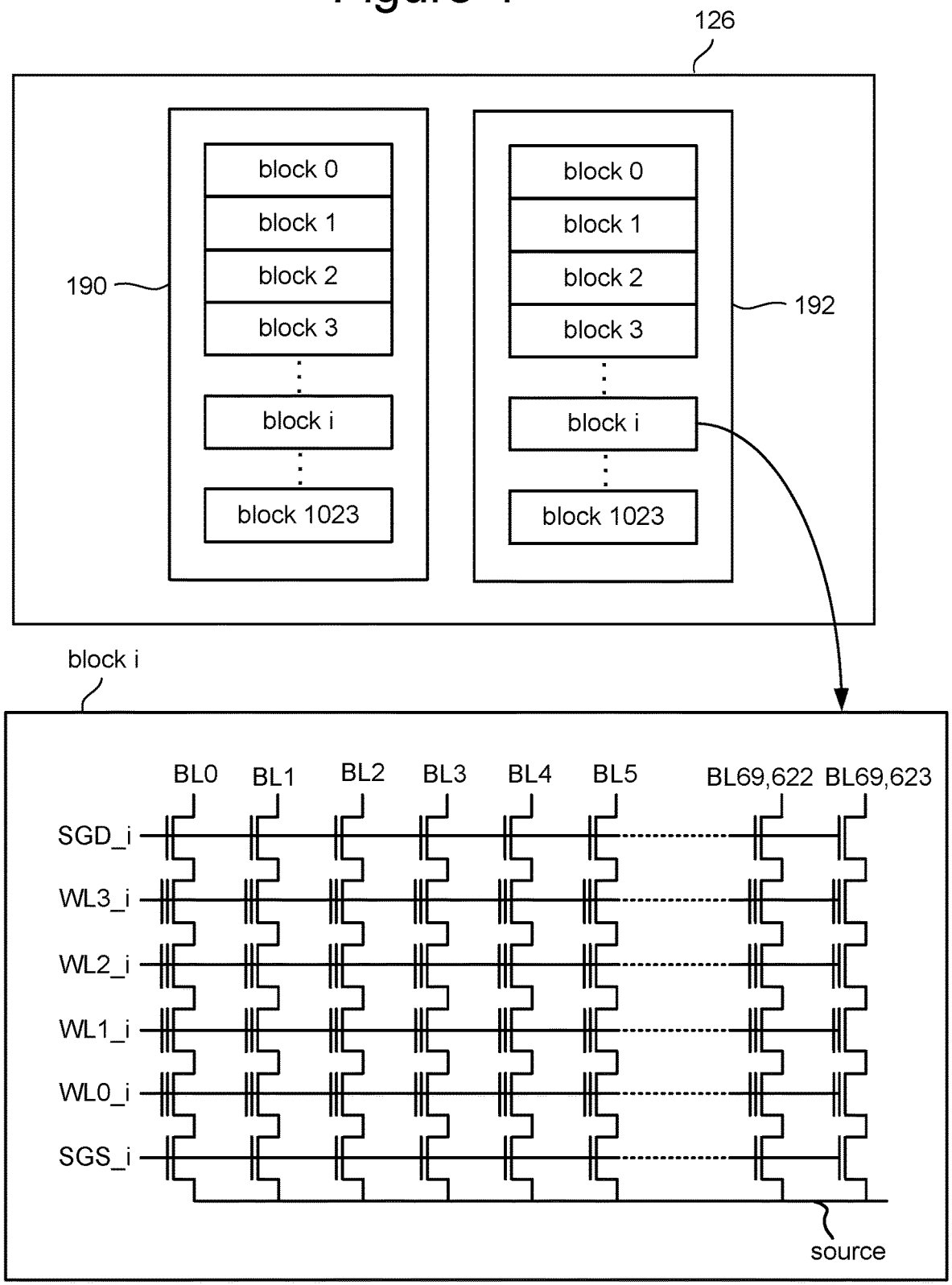
FIG. 4 is a block diagram of a memory array.

FIG. 4 depicts an exemplary structure of memory array 126. In one embodiment, the array of memory cells is divided into multiple planes. In the example of FIG. 4, memory structure 126 is divided into two planes: Plane 190 and Plane 192. In other embodiments, more or less than two planes can be used.

In some embodiments, each plane is divided into a number of memory erase blocks (e.g., blocks 0-1023, or another amount). In certain memory technologies (e.g. 2D/3D NAND), a memory erase block is a smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 4 includes memory cells that share word lines $WL0\_i$, $WL1\_i$, $WL2\_i$ and $WL3\_i$ and share bit lines BL0-BL69,623.

In one embodiment, a memory erase block (see erase block i) contains a set of NAND strings which are accessed via bit lines (e.g., bit lines BL0-BL69,623) and word lines (WL0, WL1, WL2, WL3). FIG. 4 shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS). Although FIG. 4 shows 69624 bit lines, a different number of bit lines can also be used. Additionally, as discussed above, the erase block can implement non-volatile storage technologies other than NAND flash memory.

Each erase block and/or each memory storage unit is typically divided into a number of pages. In one embodiment, a page is a unit of programming (or storing data). Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array.

In the example discussed above, the unit of erase is an erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data.

In certain memory technologies, the size of data units for other memory/storage operations such as reading or erasing are fixed size units compatible with a memory storage unit size. Typically, a memory read unit size is compatible with a memory storage unit size when the size of the memory read unit divides evenly into the memory storage unit size. Typically, a memory erase unit size is compatible with a memory storage unit size when the size of the memory erase unit is a size that is evenly divided by the memory storage unit size.

In certain embodiments, a complete memory storage unit is sized to match the number of physical memory cells across a row of the memory structure 126. In one embodiment, an incomplete memory storage unit has fewer physical memory cells than a complete memory storage unit. In another embodiment, an incomplete memory storage unit has the same number of physical memory cells as a complete memory storage unit except that certain memory cells are not functioning.

Figure 5A:
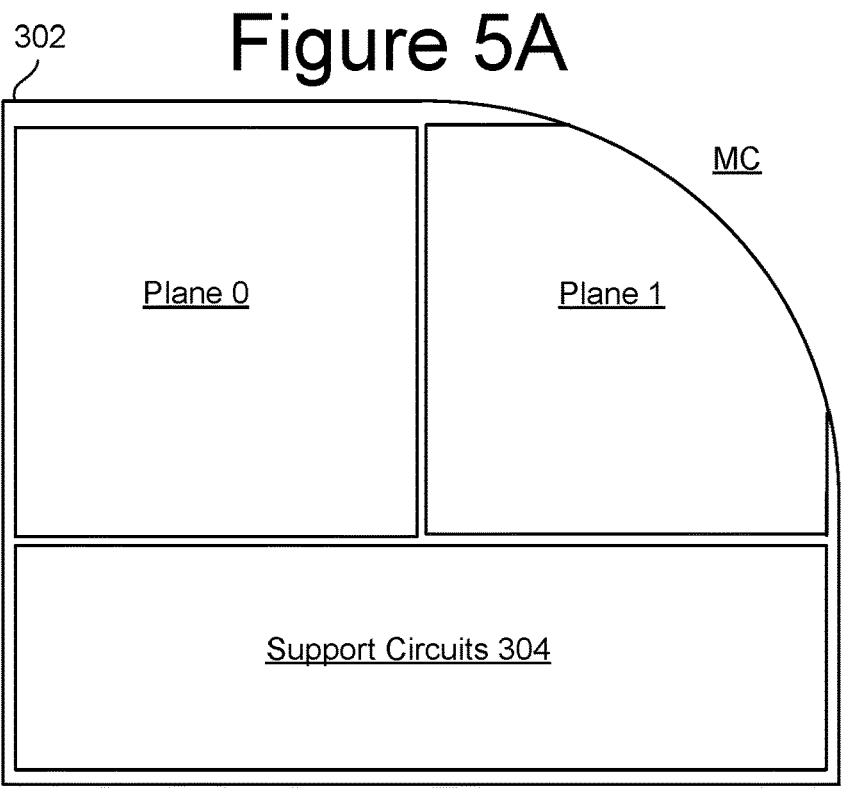
FIG. 5A depicts a partial memory die.

FIG. 5A shows a partial memory die 302, which includes an incomplete memory structure/array. For example, the partial memory die 302 was removed from an edge of a wafer such that the partial memory die is missing a portion that was not printed (or otherwise fabricated) on the wafer. That is, the partial memory dies is missing components MC that should be part of the memory die but they were not printed on the wafer because the die was at the edge of the wafer, as explained above with respect to die G of FIG. 1. In one embodiment, a complete memory die may comprise a rectangular or square shape. Partial memory die 302 is of a similar rectangular shape except for the missing portion (e.g., missing components MC). In the embodiment of FIG. 5A, the missing component may include parts of memory array for plane 1 and certain signal lines that may route around plane 1.

The incomplete memory structure of partial memory die 302 includes two planes: Plane 0 and Plane 1. In other embodiments, the memory structure can include more than two planes. Plane 0 is complete, meaning it is not missing any portion or components. In the example of FIG. 5A, Plane 1 is incomplete, meaning that Plane 1 is missing a portion of the plane that is supposed to be there. FIG. 5A shows that Plane 1 is missing components MC that were not printed on the die because the die was at the edge of the wafer. Partially printed or fabricated die may be formed because it may be more cost effective to continue the fabrication process even though certain die may extend beyond that wafer boundary rather than not fabricating the partial memory die. Plane 1 is missing components MC corresponding to components found in Plane 0. The missing components MC can include portions of the substrate, memory cells, entire NAND strings, portions or entire bit lines, portions or entire word lines, portions or entire select lines and dielectric regions. In some embodiments, Plane 1 (or the incomplete memory array) comprises a plurality of erase blocks. Some of the erase blocks are complete erase blocks, meaning that they are not missing any components. Some of the erase blocks are incomplete erase blocks, meaning that they are missing components. The erase blocks missing components are physically partial memory blocks because they are missing silicon components corresponding to silicon components found in complete erase blocks. For example, the physically partial memory blocks (incomplete erase blocks) are missing non-volatile memory cells, bit lines, portions of bit lines, word lines, portions of word line and portions of substrate corresponding to respective memory cells, bit lines, portions of bit lines, word lines, portions of word line and portions of substrate found in complete erase blocks. The control circuits discussed herein are capable of successfully programming and reading the physically partial memory blocks, as described below.

Plane 0 and Plane 1 have the same (ie common) address space size. For example, both planes may have intended to be storage for X gigabytes of data and have an address space big enough to address X gigabytes. Even though Plane 1 is incomplete, it still has the same address space size, even if it cannot use some of the address space due to missing memory cells.

Partial memory die 302 also includes Support Circuits 304, which are connected to Plane 0 and Plane 1. Support Circuits 304 can include one or more circuits that may be referred to as a control circuit for successfully performing memory operations. An example of Support Circuits 304 includes control circuitry 110, read/write circuits 128, decoders 124, and decoders 132 of FIG. 2. Other circuits can also be part of Support Circuits 351. Although FIG. 5A shows Support Circuits 304 below Plane 0 and Plane 1, in other embodiments the Support Circuits 304 can be in other positions (e.g., above, adjacent or between Plane 0 and Plane 1). Support Circuits 304 can also be divided into different sections, with each section located at different positions in the memory die. Additionally, Plane 0 and Plane 1 can be positioned differently, including layouts where the planes are not adjacent to each other.

The discussion below explains different embodiments for configuring partial memory die 302 to successfully perform memory operations.

Figure 5B:
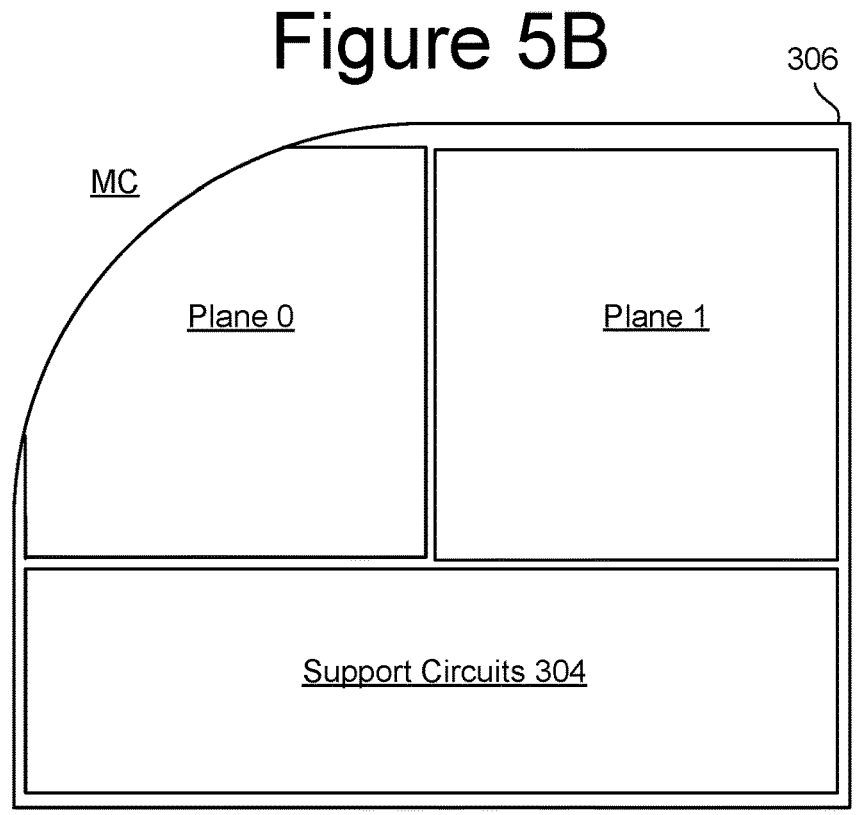
FIG. 5B depicts a partial memory die.

Partial memory die 302 is depicted with right handed curvature, as the curve representing the edge of the wafer is on the right hand side of partial memory die 302. FIG. 5B shows partial memory die 306 with left handed curvature, as the curve representing the edge of the wafer is on the left hand side of partial memory die 306. Therefore, the incomplete memory structure of partial memory die 306 includes Plane 0 and Plane 1, with Plane 0 being incomplete and Plane 1 being complete. Partial memory die 306 also includes support circuits 306, as discussed above.

While FIG. 5A shows Plane 1 being incomplete and FIG. 5B shows Plane 0 being incomplete, in other embodiments, a partial memory die can have both Plane 0 and Plane 1 as incomplete. In embodiments that have more than two planes, one or more planes can be incomplete.

Figure 6:
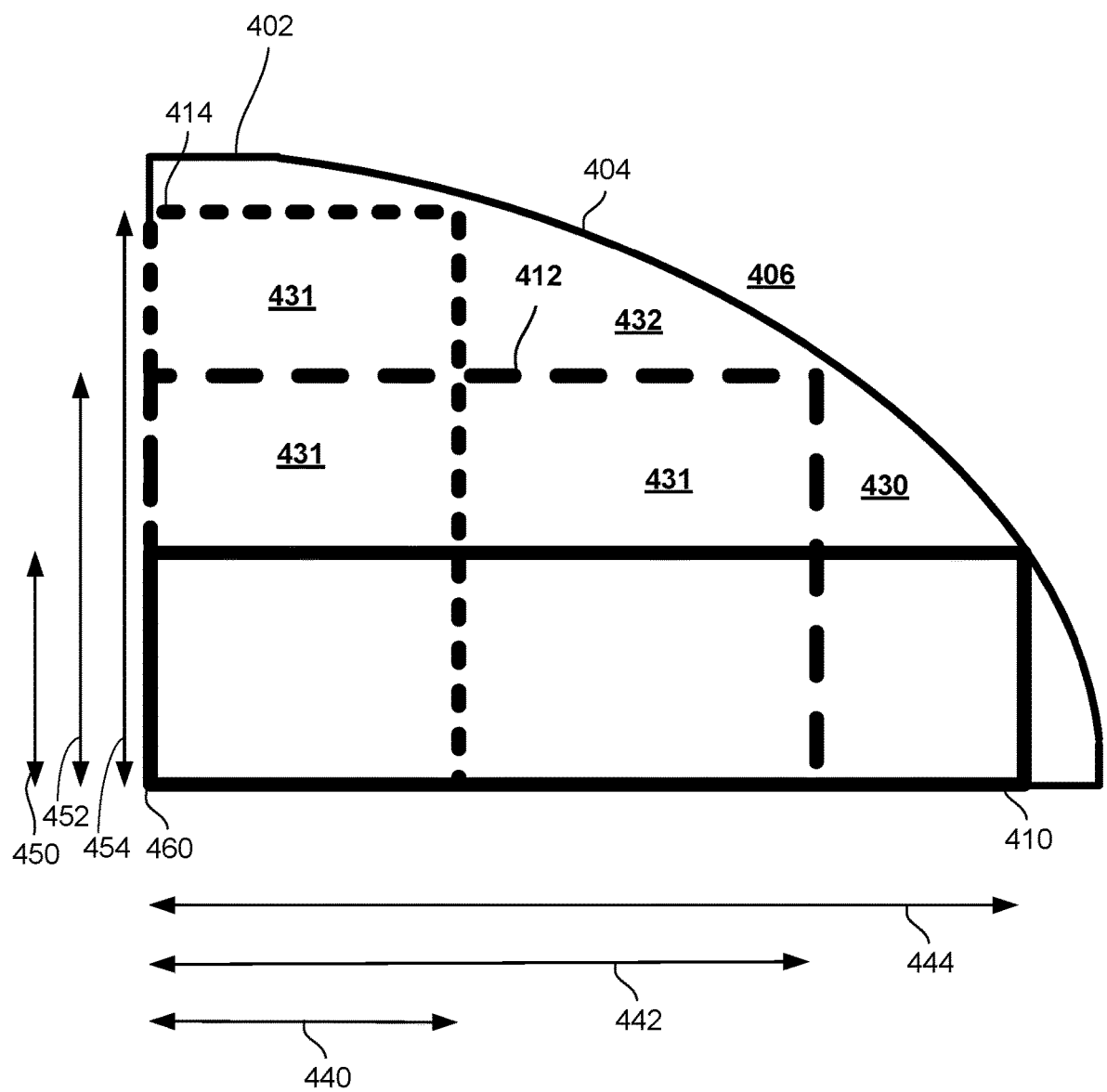
FIG. 6 depicts an incomplete plane of a partial memory die.

FIG. 6 depicts an incomplete plane 402 of a partial memory die. Incomplete plane 402 is one example embodiment of Plane 1 of partial memory die 302 depicted in FIG. 5A. Curve 404 represents the edge of the incomplete Plane 1, corresponding to where the edge of the wafer was during fabrication. Reference number 406 represents the non-existent area of where the missing (all or portions of) columns of bit lines, (all or portions of) rows of word lines and memory cells should have been if the die was not at the edge of the wafer.

In one embodiment, the partial memory die is made usable by reclaiming a usable portion of the incomplete plane of memory cells. FIG. 6 depicts three rectangular usable zones 410 (solid line), 412 (line with larger dashes) and 414 (line with smaller dashes) of the usable portion of the incomplete plane 402 of the partial memory die. Zones 410, 412 and 414 can be referred to as complete zones because within each zone of the memory structure is complete (i.e. not missing any structure).

Each of the zones has boundaries (also known as boundary information). Examples of boundaries of a zone includes a range of usable erase blocks, a range of usable word lines and/or a range of usable bit lines. Arrow 440 represents the range of usable bit lines for zone 410. Arrow 442 represents the range of usable bit lines for zone 412. Arrow 444 represents the range of usable bit lines for zone 414. Arrow 450 represents the range of usable word lines for zone 410. Arrow 452 represents the range of usable word lines for zone 412. Arrow 454 represents the range of usable word lines for zone 414.

In one embodiment, location 460 represents the origin of a coordinate system; therefore, the range of bit line numbers is zero to the maximum bit line number for the zone and the range of word line numbers is zero to the maximum word line number for the zone. In this manner, the system need only store maximum bit line number, maximum word line number and maximum erase block number for each zone as the indication of bounds of each zone. In one embodiment, boundary of each zone is stored in ROM fuses 117 (see FIG. 2).

In another embodiment, a zone need not start at the origin of the coordinate system. For example, each of the zones of FIG. 6 start at the bottom of the plane, but in other embodiments, the zones can start offset from the bottom of the plane (e.g., not closest to the sense amplifier).

In one embodiment, only one zone is implemented or used. For example, multiple zones can be determined and then the zone with the largest number of memory cells can be chosen for implementation/use. In one example, zone 410 is chosen as it is determined to be the maximum sized zone. Of the zones 410, 412 and 414, it is noted that zone 410 has the largest number of bit lines and, therefore, can program and read the largest amount of data in parallel. The one zone to implement can be chosen by the state machine, the controller or the host.

In one embodiment, the control circuit (e.g., the controller or the state machine) is configured to not perform memory operations outside of any usable zone of the incomplete memory structure. In some implementations, the control circuit will perform an out of bounds response (discussed below) if the address is on the partial memory die but outside of any first usable zone. For example, if the address to perform a memory operation corresponds to areas 430 or 432 (which are usable portions of the incomplete plane of memory cells), then the control circuit will perform an out of bounds response rather than perform the memory operation. If the chosen zone is zone 410 and the address to perform a memory operation corresponds to areas 430, 431 or 432, then), then the control circuit will perform an out of bounds response rather than perform the memory operation. In one example implementation, the zone chosen for use can be chosen based on different criteria than being the largest zone. In other embodiments, more than one zone (overlapping or non-overlapping) can be chosen.

In some embodiments, the zone is chosen once (e.g., during fabrication or testing) and that chosen zone remains the chosen zone for the life of the memory system. In other embodiments, the system can change which zone is the chosen zone during the operational life of the memory system.

The technology described above for recovering partial memory dies can be used to recover memory dies that are cracked, rather than missing components. For example, reference number 406 represents the area of missing components. Alternatively, area 406 can be a portion of the die that is cracked and unusable. That is, a cracked and unusable portion of a memory structure can be treated as if that cracked and unusable portion is missing from the memory structure.

Figure 7:
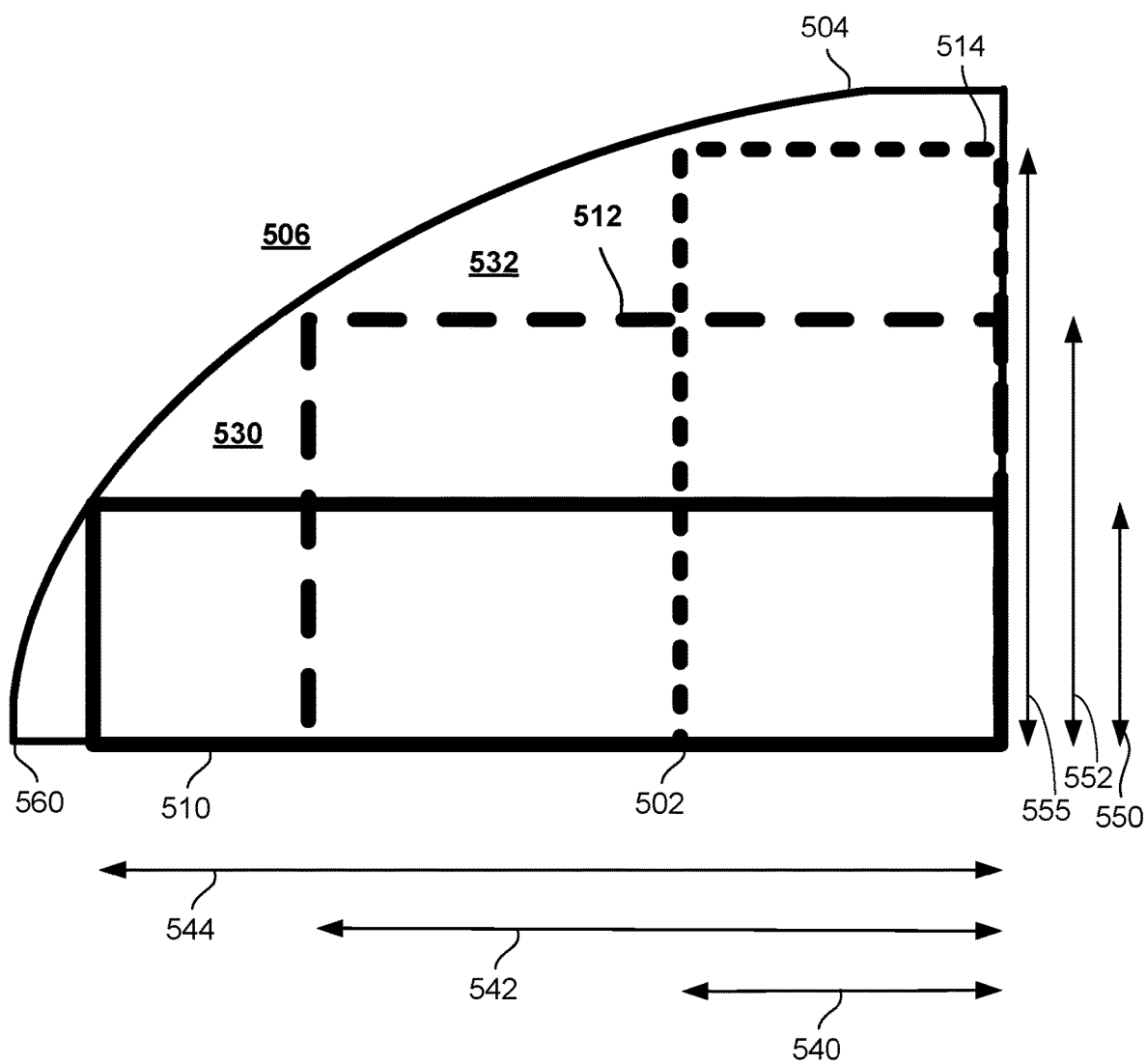
FIG. 7 depicts an incomplete plane of a partial memory die.

FIG. 7 depicts an incomplete plane 502 of a partial memory die. Incomplete plane 502 is one example embodiment of Plane 0 of partial memory die 306 depicted in FIG. 5B. Curve 504 represents the edge of the incomplete Plane 0, corresponding to where the edge of the wafer was during fabrication. Reference number 506 represents the non-existent area of where the missing (all or portions of) columns of bit lines, (all or portions of) rows of word lines and memory cells should have been if the die was not at the edge of the wafer. In one embodiment, the partial memory die is made usable by reclaiming a usable portion of the incomplete plane of memory cells. FIG. 7 depicts three rectangular usable zones 510, 512 and 514 of the usable portion of the incomplete memory structure of partial memory die 502. Zones 510, 512 and 514 can be referred to as complete zones as within each zone the memory structure is complete (i.e. not missing any structure).

Arrow 540 represents the range of usable bit lines for zone 510. Arrow 542 represents the range of usable bit lines for zone 512. Arrow 544 represents the range of usable bit lines for zone 514. Arrow 550 represents the range of usable word lines for zone 510. Arrow 552 represents the range of usable word lines for zone 512. Arrow 554 represents the range of usable word lines for zone 514. In one embodiment, location 560 represents the origin of a coordinate system. Each of the zones 510, 512 and 514 start at a position that is offset on the x axis from the origin; therefore, the range of bit line numbers is from an offset to the maximum bit line number for the zone and the range of word line numbers is zero to the maximum word line number for the zone. In this manner, the system need only store bit line offset, maximum bit line number, maximum word line number and maximum block number for each zone as the boundary of each zone. In one embodiment, the boundary of each zone is stored in ROM fuses 117 (see FIG. 2).

In one embodiment, the system only implements one zone. For example, multiple zones can be determined and then the zone with the largest number of memory cells can be chosen for implementation. The zone chosen may be based on the number of actual operational memory cells in the zone, the number of functioning word lines, the number of functioning bit lines, or other similar criteria. In one example, zone 510 is chosen as it is determined to be the zone having the highest number of functioning bit lines of the zones depicted in FIG. 7. Of the zones 510, 512 and 514, it is noted that zone 510 has the largest number of bit lines and, therefore, can program and read the largest amount of data in parallel which provides performance advantages.

Figure 8:
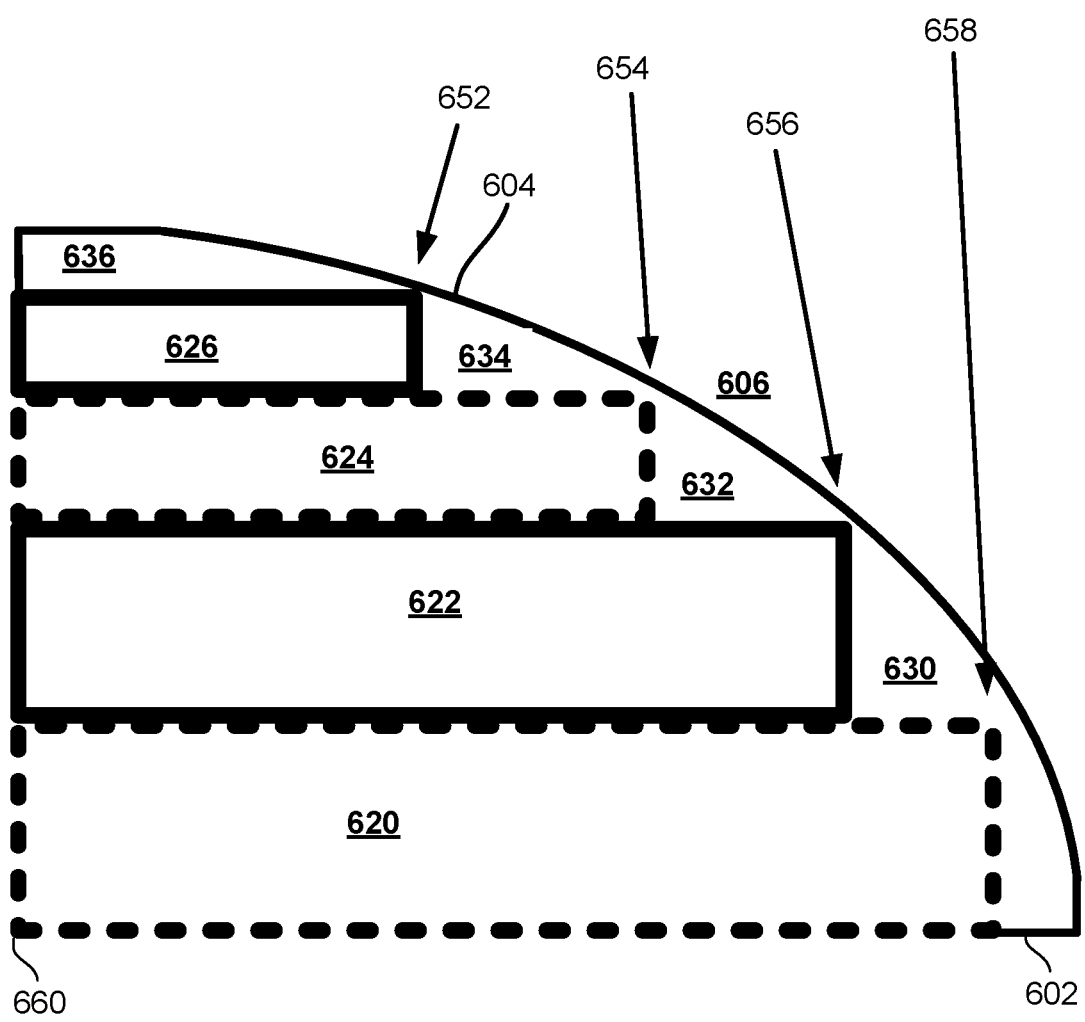
FIG. 8 depicts an incomplete plane of a partial memory die.

FIG. 8 depicts an incomplete plane 602, such as plane 1 of FIG. 5, of a partial memory die. Incomplete plane 602 is another example embodiment of Plane 1 of partial memory die 302 depicted in FIG. 5A. Curve 604 represents the edge of the incomplete Plane 1, corresponding to where the edge of the wafer was during fabrication. Reference number 606 represents the non-existent area of where the missing (all or portions of) columns of bit lines, (all or portions of) rows of word lines and memory cells should have been if the die was not at the edge of the wafer.

In one embodiment, partial memory die 602 is made usable by reclaiming a usable portion of the incomplete plane of memory cells. FIG. 8 depicts four rectangular usable zones 620, 622, 624 and 626 of the usable portion of the incomplete memory structure of partial memory die 602. Zones 620, 622, 624 and 626 can be referred to as complete zones as within each zone the memory structure is complete (i.e. not missing any structure). Zone 620 is the largest zone, in terms of largest number of memory cells or largest number of bitlines. Zone 626 is the smallest zone.

Reference number 652 indicates the maximum bit line for zone 626, meaning that zone 626's usable bit lines stop at reference 652. Reference number 654 indicates the maximum bit line for zone 624, meaning that zone 624's usable bit lines stop at reference 654. Reference number 656 indicates the maximum bit line for zone 622, meaning that zone 622's usable bit lines stop at reference 656. Reference number 658 indicates the maximum bit line for zone 620, meaning that zone 620's usable bit lines stop at reference 658. In one embodiment, location 660 represents the origin of a coordinate system; therefore, the range of bit line numbers is zero to the maximum bit line number for the zone (as indicated by 652, 654, 656 and 658) and the range of word line numbers is zero to the maximum word line number for the zone. In this manner, the system need only store maximum bit line number, maximum word line number and range of erase block numbers for each zone as the indication of bounds of each zone. In one embodiment, the boundary of each zone is stored in ROM fuses 117 (see FIG. 2).

In the embodiment of FIG. 8, the system implements multiple zones. For example, zones 620, 622, 624 and 626 can all be concurrently implemented by the memory system. Therefore, the memory system can store data in any of the zones 620, 622, 624 and 626. The zones are sized to fit within the existing portions of the memory structure, as depicted in FIG. 8.

In one embodiment, the control circuit is configured to not perform memory operations outside of any usable zone of the incomplete memory structure. For example, the control circuit will perform an out of bounds response (discussed below) if the address is on the partial memory die but outside of any first usable zone. For example, if the address to perform a memory operation corresponds to areas 630, 632 or 634 (which are usable portions of the incomplete plane of memory cells), then the control circuit performs an out of bounds response rather than perform the memory operation.

Figure 9:
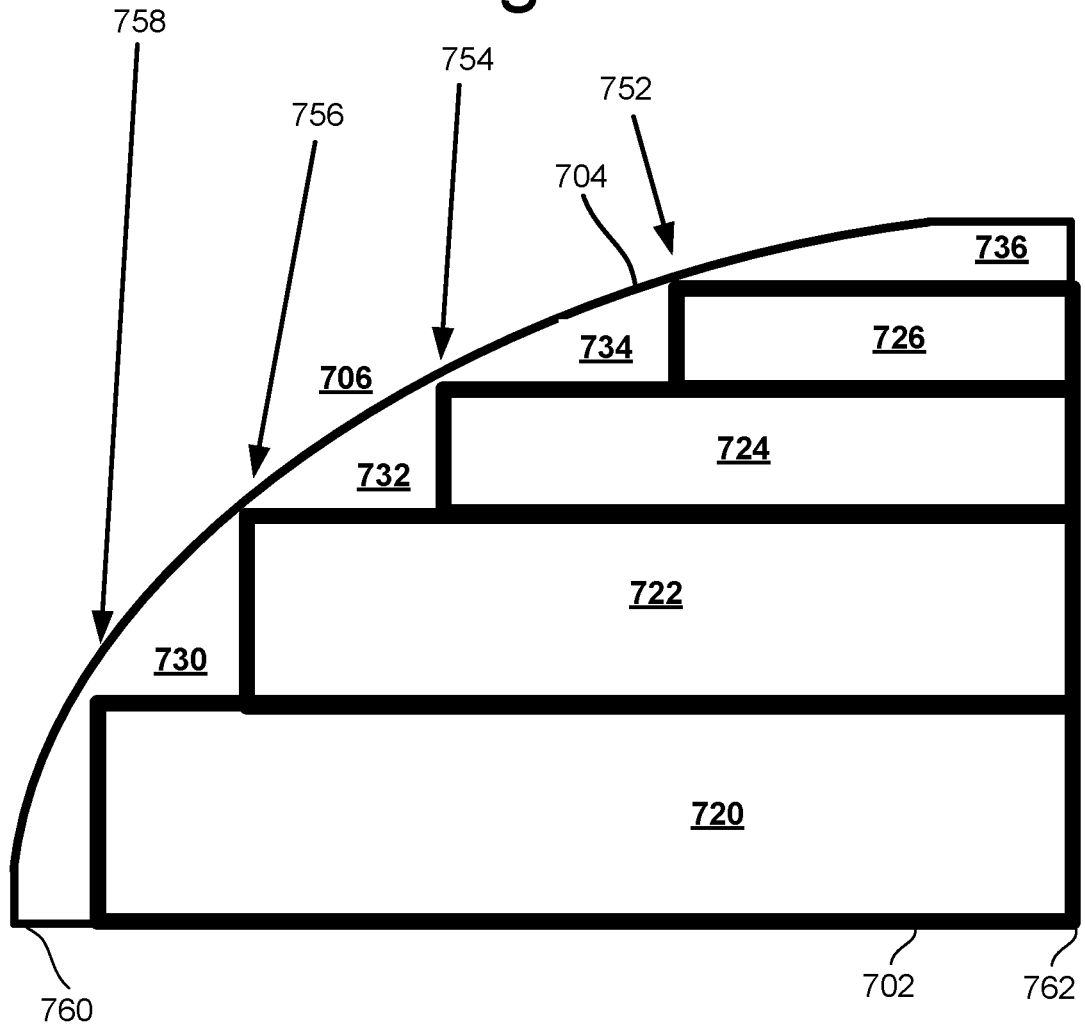
FIG. 9 depicts an incomplete plane of a partial memory die.

FIG. 9 depicts an incomplete plane 702 of a partial memory die. Incomplete plane 702 is one example embodiment of Plane 0 of partial memory die 306 depicted in FIG. 5B. While FIGS. 6 and 8 show right handed curvature, FIGS. 7 and 9 show left handed curvature. Curve 704 of FIG. 9 represents the edge of the incomplete Plane 0, corresponding to where the edge of the wafer was during fabrication. Vertical and horizontal lines below curve 704 represents (all or portions of) columns of bit lines and (all or portions of) rows of word lines that were fabricated. Vertical and horizontal lines above curve 704 represents (all or portions of) columns of bit lines and (all or portions of) rows of word lines that were not fabricated, or missing. Reference number 706 represents the non-existent area of where the missing (all or portions of) columns of bit lines, (all or portions of) rows of word lines and memory cells should have been if the die was not at the edge of the wafer.

In one embodiment, the partial memory die is made usable by reclaiming a usable portion of the incomplete plane of memory cells. FIG. 9 depicts four rectangular usable zones 720, 722, 724 and 726 of the usable portion of the incomplete memory structure of partial memory die 702. Zones 720, 722, 724 and 726 can be referred to as complete zones as within each zone the memory structure is complete (i.e. not missing any structure).

In one embodiment, location 760 represents the origin of a coordinate system. Therefore, each of the zones 720, 722, 724 and 726 start at a position that is offset on the x axis from the origin 760. Reference number 752 indicates the starting bit line for zone 726, meaning that zone 726's usable bit lines start at reference 752. Thus, reference 752 is the offset. Reference number 754 indicates the starting bit line for zone 724, meaning that zone 724's usable bit lines start at reference 754. Thus, reference 754 is the offset. Reference number 756 indicates the starting bit line for zone 722, meaning that zone 722's usable bit lines start at reference 756. Thus, reference 756 is the offset. Reference number 758 indicates the starting bit line for zone 720, meaning that zone 720's usable bit lines start at reference 758. Thus, reference 758 is the offset. All of the zones 720, 722, 724 and 726 have a range of bit lines that end at the maximum bit line number (indicated by reference 762).

The boundary of the zones includes the range of bit lines, the range of word lines and the range of erase blocks for each zone. The range of bit line numbers is from an offset for each zone (the starting bit line number) to the plane's maximum bit line number. In one embodiment, the boundary of each zone is stored in ROM fuses 117 (see FIG. 2).

In the embodiment of FIG. 9, the system implements multiple zones. For example, zones 720, 722, 724 and 726 can all be concurrently implemented by the memory system. The memory system can store data in any of the zones 720, 722, 724 and 726. The zones are sized to fit within the existing portions of the memory structure, as depicted in FIG. 9. The memory system programs to or reads from the zone that corresponds to the physical address associated with the memory operation.

In one embodiment, the control circuit is configured to not perform memory operations outside of any usable zone of the incomplete memory structure. The control circuit will perform an out of bounds response (discussed below) if the address is on the partial memory die but outside of any first usable zone. For example, if the address to perform a memory operation corresponds to areas 730, 732 or 734 (which are usable portions of the incomplete plane of memory cells), then the control circuit performs an out of bounds response rather than perform the memory operation.

Each of the zones of FIGS. 6-9 comprise one more erase block of non-volatile memory cells (e.g., three dimensional flash memory). In memory systems that do not arrange the memory cells in erase blocks, the zones comprise different units or amounts of memory cells. Other embodiments can implement different zones than those depicted in FIGS. 6-9.

Figure 10:
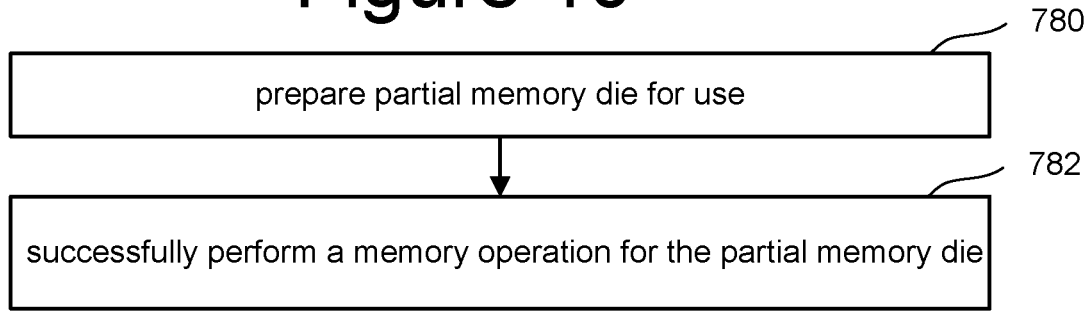
FIG. 10 is a flow chart describing one embodiment of a process for utilizing a partial memory die.

FIG. 10 is a flowchart describing one embodiment for the process for utilizing a partial memory die. For example, the process of FIG. 10 can be performed for partial memory die 302 or partial memory die 306, including the embodiments of FIGS. 6-9. In step 780 of FIG. 10, the partial memory die is prepared for use. In step 782, the partial memory die successfully performs a memory operation.

Figure 11:
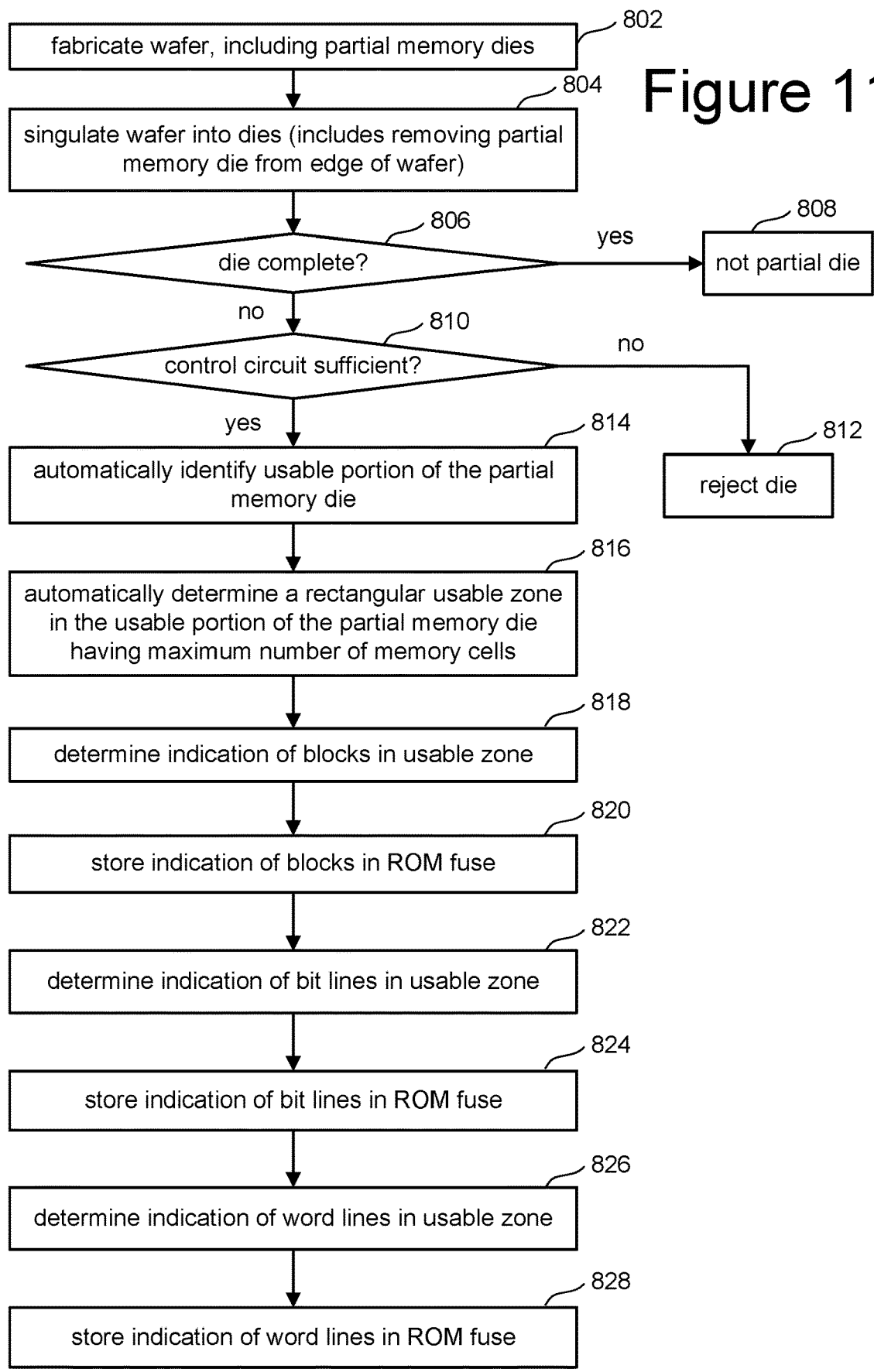
FIG. 11 is a flow chart describing one embodiment of a process for preparing a partial memory die for use.

FIG. 11 is a flowchart describing one embodiment of the process for preparing the partial memory die for use. That is, the process of FIG. 11 is one example implementation of step 780 of FIG. 10 for the embodiments of FIGS. 6 and 7 that choose one zone. In step 802, a wafer is fabricated. This includes fabricating the complete memory dies and the partial memory dies. In step 804, the wafer is singulated into separate dies including complete memory dies and partial memory dies. In step 806, it is determined whether each of the memory dies is complete. That is whether a portion of the memory die is missing because the memory die was at the edge of the wafer. If the memory die is complete, then it is not a partial memory die (step 808). If the memory die is not complete, then it is partial memory die and the process continues to step 810. Step 810 is performed for each of the memory dies that were singulated from the wafer in step 804. In step 810, it is determined whether the control circuit is sufficient. That is, if portions of the control circuit are missing, the memory die may not be useful. For example, looking at FIGS. 5A and 5B, support circuits 304 are depicted as being complete. The control circuit needed to perform the memory operation is a part of the support circuits 304. If sufficient amount of the control circuit is not present, the die will be rejected in step 812.

If there is sufficient portions of the control circuit on the die (e.g. in one embodiment the entire support circuits 304 including the entire control circuit must be present), then in step 814, the usable portion of the partial memory die is automatically identified. In one embodiment, the software for performing layout of the wafer can automatically indicate the usable portion of the partial memory die. In another embodiment, image sensors and computer vision software can be used to inspect the partial memory die to automatically indicate the usable portion of the partial memory die. In another embodiment, a human operator can manually inspect the partial memory die to identify the usable portion of the partial memory die.

Step 816 includes automatically determining a rectangular usable zone in the usable portion of the partial memory die having maximum number of memory cells. For example, multiple zones can be identified (e.g., zones 410, 412 or 414) and then the largest zone is chosen. The largest zone can be the zone with the most memory cells, the zone with the most functional bit lines, the zone with the most functional word lines or the zone meeting another criteria relating to capacity, operability, or performance. A usable zone is also known as a complete zone since the zone is not missing any of the intended components because of being on the edge of the wafer.

Step 818 includes determining an indication of the range of wordlines or blocks in the chosen zone. In one embodiment, blocks outside of the zone are not used to store data. In other embodiments, blocks outside of the chosen zone can be used to store data with the associated logic and adjustments needed. In step 820, the indication of the range of blocks in the chosen zone is stored in ROM fuses 117. Step 822 includes determining an indication of the range of bit lines in the chosen zone. In step 824, the indication of the range of bit lines in the chosen zone is stored in ROM fuses 117. As discussed above, for left handed curvature, the bit line offset is used to determine the range of bit lines and/or the bit line offset can be recorded in ROM fuses 117. Step 826 includes determining an indication of the range of word lines in the chosen zone. In step 828, the indication of the range of word lines in the chosen zone is stored in ROM fuses 117. The indication of blocks, bit lines and word lines comprise an example of an indication of bounds of the useable zone.

Figure 12:
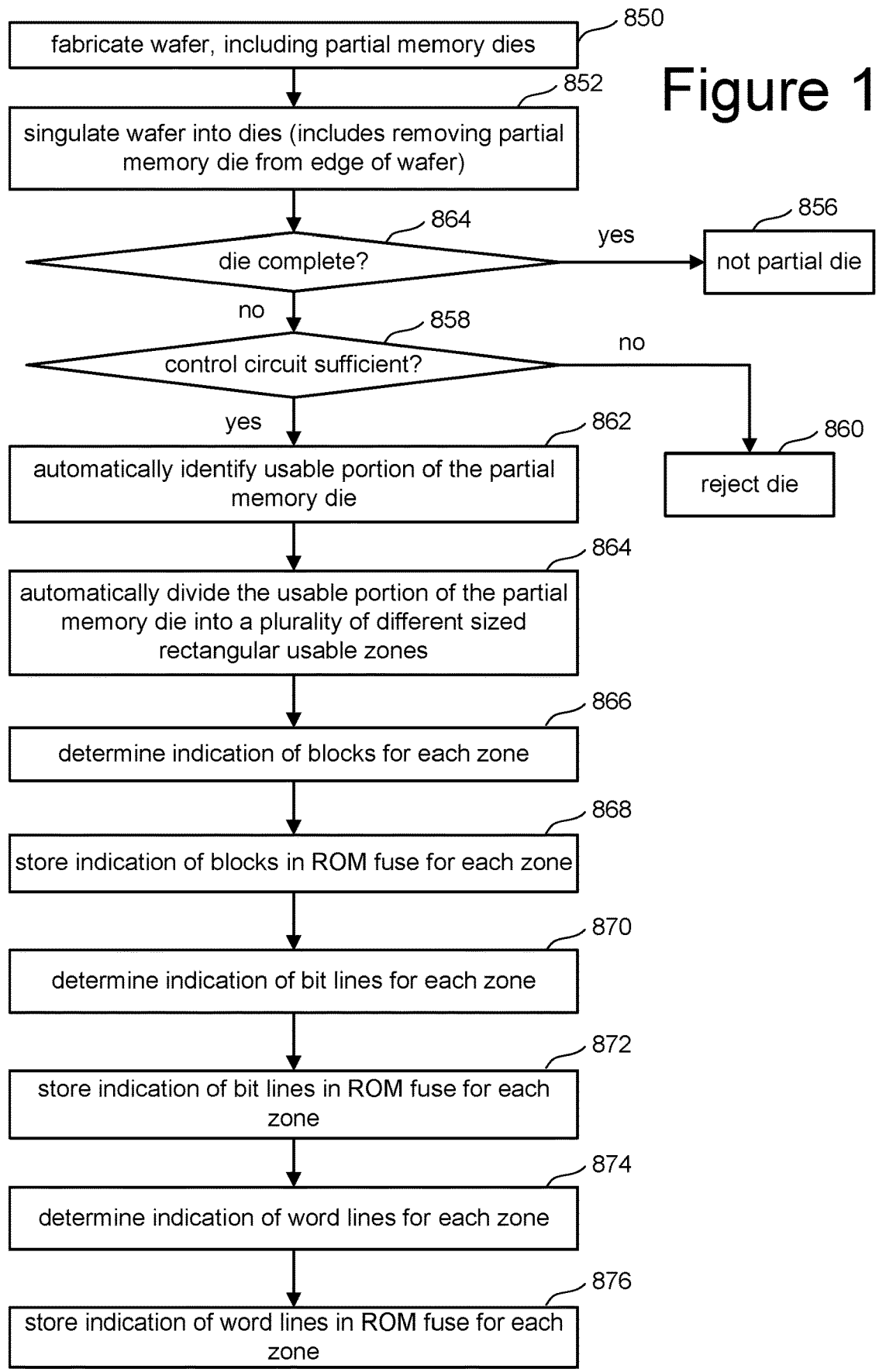
FIG. 12 is a flow chart describing one embodiment of a process for preparing a partial memory die for use.

FIG. 12 is a flowchart describing one embodiment of the process for preparing the partial memory die for use. That is, the process of FIG. 11 is one example implementation of step 780 of FIG. 10 for the embodiments of FIGS. 8 and 9 that concurrently use multiple zones. Steps 850-862 of FIG. 12 are the same as steps 802-814 of FIG. 11. In one embodiment, the processes of FIGS. 11 and 12 are performed by testing equipment at the fabrication facility for the memory.

In step 864 of FIG. 12, the identified usable portion of the partial memory die is automatically divided into a plurality of different sized rectangular usable (complete) zones (e.g., zones 620, 622, 624 and 626 of FIG. 8 or zones 720, 722, 724 and 726 of FIG. 9.

Step 866 includes determining an indication of the range of blocks for each zone. In step 868, the indication of the range of blocks for each zone is stored in ROM fuses 117. Step 870 includes determining an indication of the range of bit lines for each zone. In step 872, the indication of the range of bit lines for each zone is stored in ROM fuses 117. As discussed above, for left handed curvature, the bit line offset is used to determine the range of bit lines and/or the bit line offset can be recorded in ROM fuses 117. Step 874 includes determining an indication of the range of word lines for each zone. In step 876, the indication of the range of word lines for each zone is stored in ROM fuses 117.

Figure 13:
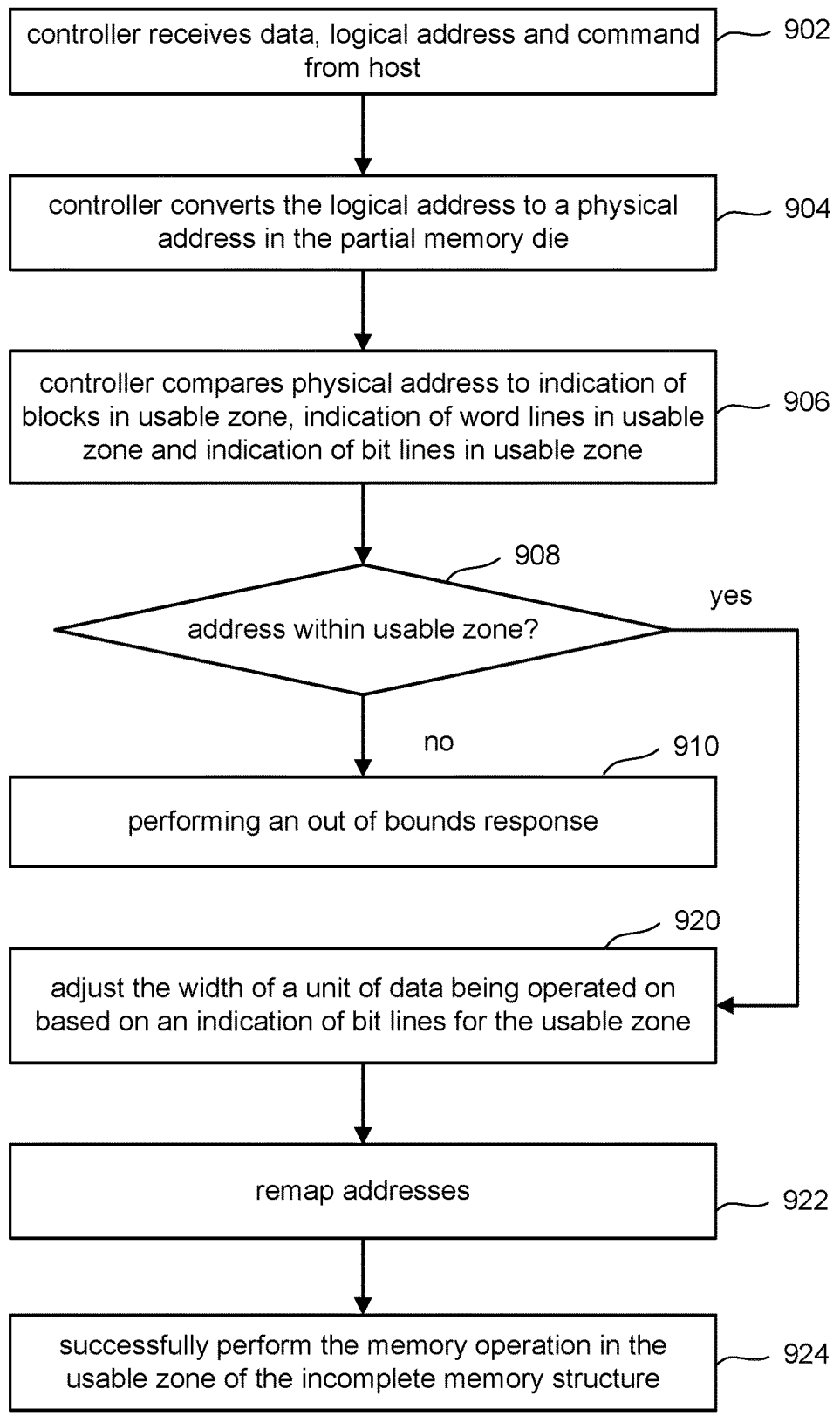
FIG. 13 is a flow chart describing one embodiment of a process for successfully performing a memory operation for a partial memory die.

FIG. 13 is a flowchart describing one embodiment of a process for performing a memory operation for a partial memory die. Thus, the processes of FIG. 13 is one example implementations of step 782 of FIG. 10. The process of FIG. 13 can be performed by partial memory die 302 of FIG. 5A or partial memory die 306 of FIG. 5B, for the embodiments of FIGS. 6 and 7. Note that the steps of FIG. 13 be performed in the order as depicted or in a different order.

In step 902 of FIG. 13, the controller (e.g. controller 122 of FIGS. 2 and/or 3) receives data, a logical address and a command from a host which is in communication with the controller. In step 904, the controller converts the logical address to a physical address in the partial memory die. In step 906, the controller compares physical address to an indication of blocks in the usable zone, indication of word lines in the usable zone and indication of bit lines in the usable zone. That is, the controller is configured to determine whether the address for the memory operation is within the single usable zone of the incomplete memory structure by determining whether a block corresponding to the address is within a range of usable blocks, a word line corresponding to the address is within a range of usable word lines and a bit line corresponding to the address is within a range of usable bit lines. In one embodiment, at power-on or reset the controller reads the contents of ROM fuses 117 and stores that information in local memory (e.g., RAM 122b or RAM 216). That stored information is used to perform step 906. If, in step 908, it is determined that the physical address (from step 904) does not correspond to a location in the usable zone (e.g., zone 410 or zone 510), then the controller performs an out of bounds response in step 910. One embodiment of an out of bounds response is to send an error message (e.g., out of bounds error) to the host. In, another embodiment, an out of bounds response is to choose another physical address and update the L2P tables that correlates logical addresses to physical addresses. If, in step 908, it is determined that the physical address (from step 904) does correspond to a location in the usable zone (e.g., zone 410 or zone 510), then the controller (e.g., operation adjustment module or circuit) adjusts the width of the unit of data being operated on based on the boundary information, such as an indication of bit lines for the usable zone in step 920. That is, the page size will be adjusted to match (or be less than) the number of bit lines in the zone. For example, if a complete memory plane has 16K bit lines to concurrently program 16K bits of a page of data but the partial memory die is using a zone with only 8K bit lines, then the controller adjusts the page size to 8K and only present 8K of data for each program operation. In step 922, the controller (e.g., operation adjustment module or circuit) remaps one or more addresses due to the change in page size. For example, if one page of data is broken into two pages of data, then an additional address may be needed. Alternatively, a first address can be changed to a second address to accommodate the physical characteristics of the zone. Steps 920 and 922 comprise modifying a memory operation in response to the memory operation targeting memory cells outside a usable zone of the incomplete memory array In some embodiments, steps 920 and 922 are optional. In step 924, the controller will instruct the partial memory die to perform the memory operation (e.g., program, erase, read). In response to the instruction from the controller, the partial memory die performs the memory operation (as part of step 922). In one embodiment, steps 906-924 are performed by the controller 122. In another embodiment, steps 906-924 (or a subset of those steps) are performed by the state machine 112. In some embodiments, steps 920 and 922 are performed as part of step 924 by a circuit on the memory die (e.g., operation adjustment circuit OA 119).

Figure 14:
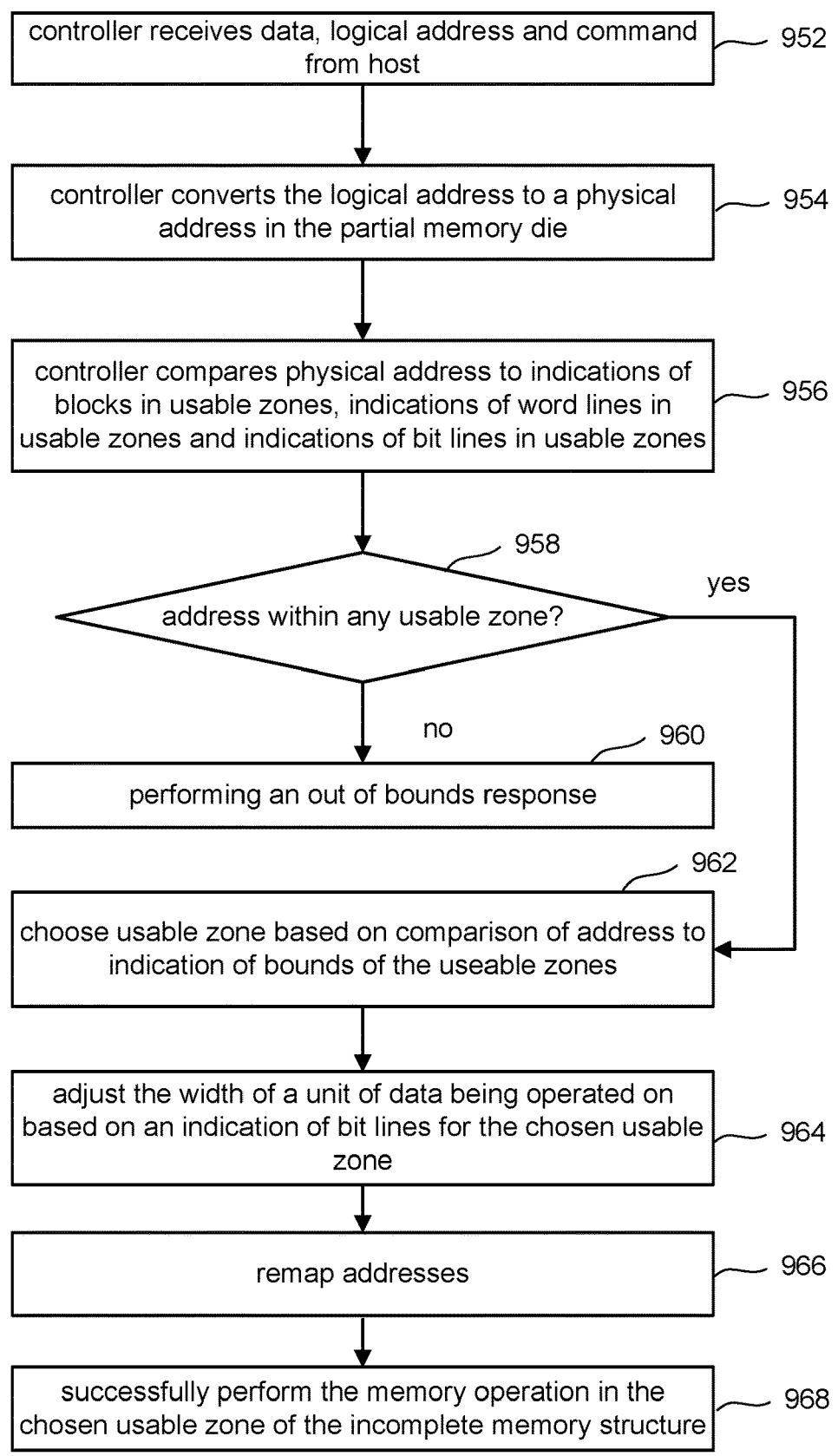
FIG. 14 is a flow chart describing one embodiment of a process for successfully performing a memory operation for a partial memory die.

FIG. 14 is a flowchart describing another embodiment of a process for performing a memory operation for a partial memory die. Thus, the processes of FIG. 14 is another example implementations of step 782 of FIG. 10. The process of FIG. 14 can be performed by partial memory die 302 of FIG. 5A or partial memory die 306 of FIG. 5B, for the embodiments of FIGS. 8 and 9. Note that the steps of FIG. 14 be performed in the order as depicted or in a different order.

In step 952 of FIG. 14, the controller (e.g. controller 122 of FIGS. 2 and/or 3) receives data, a logical address and a command from a host which is in communication with the controller. In step 954, the controller converts the logical address to a physical address in the partial memory die. In step 956, the controller compares physical address to the indications of the ranges of blocks in the multiple usable zones, indication of ranges of word lines in the multiple usable zones and indications of bit lines in the multiple usable zones. Examples of the multiple usable/complete zones include zones 620, 622, 624 and 626 of FIG. 8 and zones 720, 722, 724 and 726 of FIG. 9. That is, the controller is configured to determine whether the address for the memory operation is within the multiple usable zones of the incomplete memory structure by determining whether a block corresponding to the address is within one of the ranges of usable blocks, a word line corresponding to the address is within one of the ranges of usable word lines and a bit line corresponding to the address is within one of the ranges of usable bit lines. In one embodiment, at power-on or reset the controller reads the contents of ROM fuses 117 and stores that information in local memory (e.g., RAM 122b or RAM 216). That stored information is used to perform step 956. If, in step 958, it is determined that the physical address (from step 954) does not correspond to a location in any usable zone, then the controller performs an out of bounds response in step 960.

If, in step 958, it is determined that the physical address (from step 904) does correspond to a location in one of the usable zones, then in step 962 the controller chooses (or identifies or records) the usable zone that the physical address (from step 954) corresponds. Steps 958 and 962 are performed based on the comparison of the physical address to the indications of bounds of the usable zones. In step 964, the controller (e.g., operation adjustment module or circuit) adjusts the width of the unit of data being operated on based on an indication of bit lines for the chosen usable zone. In step 966, the controller (e.g., operation adjustment module or circuit) remaps one or more addresses due to the change in page size. For example, if one page of data is broken into two pages of data, then an additional address may be needed. Alternatively, a first address can be changed to a second address to accommodate the physical characteristics of the zone. Steps 964 and 966 comprise modifying a memory operation in response to the memory operation targeting memory cells outside a usable zone of the incomplete memory array In some embodiments, steps 964 and 966 are optional. In step 968, the controller instructs the partial memory die to perform the memory operation (e.g., program, erase, read). In response to the instruction from the controller, the partial memory die performs the memory operation (as part of step 964). In one embodiment, steps 956-968 are performed by controller 122. In another embodiment, steps 956-968 (or a subset of those steps) are performed by the state machine 112. In some embodiments, steps 964 and 966 are performed as part of step 968 by a circuit on the memory die (e.g., operation adjustment circuit 119).

Figure 15:
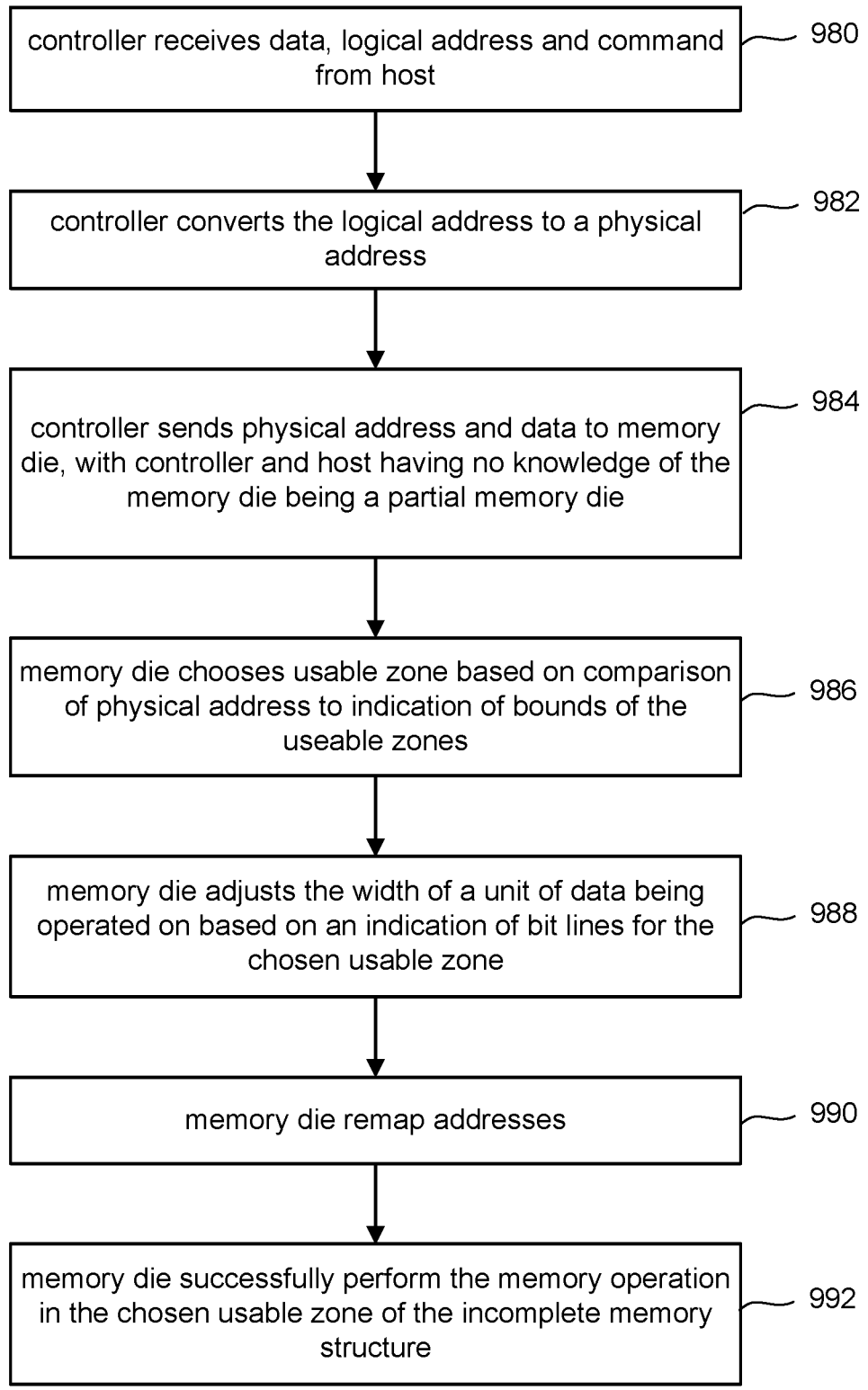
FIG. 15 is a flow chart describing one embodiment of a process for successfully performing a memory operation for a partial memory die.

FIG. 15 is a flowchart describing one embodiment of a process for performing a memory operation for a partial memory die. Thus, the processes of FIG. 15 is one example implementations of step 782 of FIG. 10. The process of FIG. 15 can be performed by partial memory die 302 of FIG. 5A or partial memory die 306 of FIG. 5B, for the embodiments of FIGS. 6 and 7. Note that the steps of FIG. 15 may be performed in the order as depicted or in a different order. The process of FIG. 15 pertains to the embodiment in which the adjustment/compensation/change is made because the memory die is a partial memory die. In certain embodiments, the adjustment/compensation/change is performed entirely by the memory die such that the controller and/or host is oblivious to the situation and need not be changed or even aware that the memory die is making this adjustment/compensation/change. The memory die may use more memory cells to accommodate the data received that would have been stored in missing or inoperable memory cells. In certain embodiments, the memory die is configured to determine whether or not it can service the host request due to the memory die being a partial memory die. If there is not enough memory cells to service the host request, the memory die may report a suitable error status to the host.

In step 980 of FIG. 15, the controller (e.g. controller 122 of FIGS. 2 and/or 3) receives data, a logical address and a command from a host which is in communication with the controller. In step 982, the controller converts the logical address to a physical address in the memory die. However, the controller may not know that the memory die is a partial memory die. In step 984, the controller sends the physical address and the data to the memory die, with a command to perform the memory operation. In some embodiments, no data is sent to the memory die (e.g., if the memory operation is a read operation).

In step 986, the partial memory die (e.g., operation adjustment circuit OA 119) chooses (or identifies or records) the usable zone that the physical address (from step 982) corresponds based on the stored range of usable blocks, range of usable word lines and/or range of usable bit lines. In one embodiment, the operation adjustment circuit OA 119 reads the contents of ROM fuses 117 to access these ranges. In step 988, the partial memory die (e.g., operation adjustment circuit OA 119) adjusts the width of the unit of data being operated on based on the boundary information, such as an indication of bit lines for the usable zone. That is, the page size will be adjusted to match (or be less than) the number of bit lines in the zone. For example, if a complete memory plane has 16K bit lines to concurrently program 16K bits of a page of data but the partial memory die is using a zone with only 8K bit lines, then the operation adjustment circuit OA 119 adjusts the page size to 8K and only present 8K of data for each program operation. In step 990, the partial memory die (e.g., operation adjustment circuit OA 119) remaps one or more addresses due to the change in page size. For example, if one page of data is broken into two pages of data, then an additional address may be needed. Alternatively, a first address can be changed to a second address to accommodate the physical characteristics of the zone. Steps 988 and 990 comprise modifying a memory operation in response to the memory operation targeting memory cells outside a usable zone of the incomplete memory array. In step 992, the partial memory die performs the memory operation (e.g., program, erase, read) at the direction of state machine 112.

The technology described above for recovering partial memory dies can be used to recover memory dies that have one or multiple planes as being incomplete. Additionally, the technology described above for recovering partial memory dies can be used to recover memory dies that are cracked, rather than missing components.

The above-described technology allows for the use of partial memory dies, thereby increasing yield of the semiconductor manufacturing process.

One embodiment includes an apparatus, comprising: an incomplete memory array on a partial memory die; an operation adjustment circuit configured to modify a memory operation in response to the memory operation targeting memory cells outside a first usable zone of the incomplete memory array; and a control circuit connected to the incomplete memory array. The control circuit is configured to perform the memory operation in the first usable zone of the incomplete memory array. In some example implementations, the operation adjustment circuit is configured to remap a target address for the memory operation from an address outside the first usable zone to an address in the first usable zone. In some example implementations, the operation adjustment circuit is configured adjust the unit of operation for the memory operation.

One embodiment includes as apparatus, comprising: an incomplete memory structure on a partial memory die; and a control circuit connected to the incomplete memory structure. The control circuit is configured to determine whether an address for a memory operation is within a first usable zone of the incomplete memory structure and successfully perform the memory operation in the first usable zone of the incomplete memory structure if the address is within the first usable zone.

One embodiment includes a method comprising: receiving logical addresses for memory operations to be performed on a partial memory die; determining physical addresses corresponding to the logical addresses; performing an out of bounds response for a physical address that is on the partial memory die but outside of a predetermined complete zone of the partial memory die; and performing memory operations for physical addresses that are on the partial memory die and inside of the predetermined complete zone of the partial memory die.

One embodiment includes an apparatus, comprising: an incomplete memory structure on a partial memory die; means for storing boundary information of one or more usable zones of the incomplete memory structure; and means for performing memory operations in the one or more usable zones based on the boundary information of one or more usable zones of the incomplete memory structure on the partial memory die.

In one embodiment, the incomplete memory structure comprises complete memory blocks and physically partial memory blocks. The physically partial memory blocks are missing substrate, memory cells and portions of bit lines corresponding to substrate, memory cells and portions of bit lines found in the complete memory blocks.

Examples of means for storing boundary information of one or more usable zones include ROM fuses (e.g., ROM fuses 118 of FIG. 2), latches, registers, flip flops, portions of RAM, portions of ROM, portions of volatile memory and/or portions of non-volatile memory.

Examples of means for performing memory operations in the one or more usable zones based on the boundary information include controller 122 or state machine 112 (or another processor) performing the process of FIG. 13 or 14.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
an incomplete memory structure on a partial memory die, the incomplete memory structure comprising memory cells; and
a control circuit connected to the incomplete memory structure, the control circuit is configured to modify a memory operation in response to the memory operation targeting memory cells outside a first usable zone of the incomplete memory structure and perform the memory operation in the first usable zone of the incomplete memory structure.

2. The apparatus of claim 1, further comprising:
one or more storage devices configured to store boundary information of the first usable zone of the incomplete memory structure.

3. The apparatus of claim 2, wherein:
the control circuit is configured to adjust a width of data to be operated on in the memory operation based on the boundary information of the first usable zone.

4. The apparatus of claim 2, wherein:
the boundary information of the first usable zone includes an indication of bit lines and an indication of erase blocks.

5. The apparatus of claim 1, wherein:
the control circuit is configured to determine whether an address for the memory operation is within the first usable zone and perform an out of bounds response if the address is on the partial memory die but outside of any usable zone.

6. The apparatus of claim 5, wherein:
the control circuit is configured to determine whether the address for the memory operation is within the first usable zone of the incomplete memory structure by determining whether an erase block corresponding to the address is within a range of usable erase blocks and a bit line corresponding to the address is within a range of usable bit lines.

7. The apparatus of claim 1, wherein:
the incomplete memory structure includes multiple different sized usable zones, including the first usable zone; and
the control circuit is configured to determine which usable zone of the multiple different sized usable zones corresponds to the address.

8. The apparatus of claim 7, wherein:
the control circuit is configured to adjust the width of a unit of data being operated on based on an indication of a range of bit lines for the first usable zone determined to correspond to the address.

9. The apparatus of claim 1, wherein:
the control circuit is configured to not perform memory operations for addresses on the partial memory die but outside of any usable zone.

10. The apparatus of claim 1, wherein:
the incomplete memory structure includes multiple planes of memory;
a first plane of the multiple planes of memory is complete; and
a second plane of the multiple planes of memory is incomplete, the second plane is missing components corresponding to components found in the first plane.

11. The apparatus of claim 1, wherein:
the control circuit is one or more of a controller that is external to the partial memory die and a state machine on the partial memory die; and
the control circuit includes an operation adjustment circuit.

12. The apparatus of claim 1, wherein:
the control circuit is configured to remap a target address for the memory operation from an address outside the first usable zone to an address in the first usable zone.

13. The apparatus of claim 1, wherein:
the control circuit is configured adjust the unit of operation for the memory operation.

14. A method comprising:
receiving logical addresses for memory operations to be performed on a partial memory die, the partial memory die comprises a memory structure and a support circuit connected to the memory structure, the partial memory die is missing components due to a portion of the memory structure not being fabricated;
determining physical addresses corresponding to the logical addresses;
performing an out of bounds response for a physical address that is on the partial memory die but outside of a predetermined complete zone of the partial memory die; and
performing memory operations for physical addresses that are on the partial memory die and inside of the predetermined complete zone of the partial memory die.

15. The method of claim 14, further comprising:
adjusting width of data to be programmed based on an indication of bit lines for an erase block in the predetermined complete zone of the partial memory die, the erase block is associated with a first address of the determined physical addresses and a program operation of the memory operations.

16. The method of claim 14, further comprising:
choosing which complete zone of a plurality of different sized complete zones correspond to a given physical address; and
performing a memory operation in the chosen complete zone.

17. The method of claim 16, further comprising:
removing the partial memory die from an edge of a wafer;
automatically identifying a usable portion of the partial memory die; and
dividing the usable portion of the partial memory die into the plurality of different sized complete zones.

18. The method of claim 14, further comprising:
removing the partial memory die from an edge of a wafer;
automatically identifying a usable portion of the partial memory die; and
determining a rectangular zone in the usable portion of the partial memory die to be the predetermined complete zone.

19. An apparatus, comprising:
an incomplete memory structure that is missing components due to a portion of the incomplete memory structure not being fabricated, the incomplete memory structure being positioned on a memory die that is a partial memory die because the memory die is missing components due to the portion of the incomplete memory structure not being fabricated;

means for storing boundary information of one or more usable zones of the incomplete memory structure; and means for performing memory operations in the one or more usable zones based on the boundary information of one or more usable zones of the incomplete memory structure on the partial memory die.

20. The apparatus of claim 19, wherein:

the incomplete memory structure comprises complete memory blocks and physically partial memory blocks; and the physically partial memory blocks are missing substrate, memory cells and portions of bit lines corresponding to substrate, memory cells and portions of bit lines found in the complete memory blocks.

\* \* \* \* \*